United States Patent [19]

Jordan

[11] Patent Number: 5,295,158
[45] Date of Patent: Mar. 15, 1994

[54] DYNAMICALLY SELECTABLE MULTIMODE PLUSE WIDTH MODULATION SYSTEM

[75] Inventor: Edward P. Jordan, Greensboro, N.C.

[73] Assignee: Analog Devices, Inc., Norwood, Mass.

[21] Appl. No.: 889,821

[22] Filed: May 29, 1992

[51] Int. Cl.⁵ .......................... H03K 7/08; H03K 9/08; H03K 5/22; H04J 15/00
[52] U.S. Cl. ...................................... 375/22; 370/9; 307/265; 307/234; 328/111; 332/109
[58] Field of Search .................. 375/22; 307/234, 265; 338/111, 112; 370/9; 332/109, 110, 111

[56] References Cited
U.S. PATENT DOCUMENTS

| | | | |
|---|---|---|---|
| 4,272,690 | 6/1981 | Riney et al. | 375/22 |
| 4,675,546 | 6/1987 | Shaw | 307/265 |
| 5,045,800 | 9/1991 | Kung | 307/265 |
| 5,119,045 | 6/1992 | Sato | 332/109 |
| 5,144,265 | 9/1992 | Petzold | 375/22 |

Primary Examiner—Curtis Kuntz
Assistant Examiner—Duane Kobayashi
Attorney, Agent, or Firm—Joseph S. Iandiorio

[57] ABSTRACT

A dynamically selectable multimode pulse width modulation system includes ramp generator means for generating a ramp; pulse edge modulation means responsive to the ramp generator means for defining a leading edge modulated pulse, a trailing edge modulated pulse and a dual edge modulated pulse; and mode selection means responsive to the pulse edge modulation means for selecting one of the leading edge modulation, trailing edge modulation, and dual edge modulation modes of pulse width modulation.

15 Claims, 5 Drawing Sheets

DYNAMICALLY SELECTABLE MULTIMODE PLUSE WIDTH MODULATION SYSTEM

FIELD OF INVENTION

This invention relates to a dynamically selectable multimode pulse width modulation system, and more particularly to such a system in which all modes are derived from the same ramps.

BACKGROUND OF INVENTION

Multimode pulse width modulation systems are those that can selectively provide leading edge modulation (LEM), trailing edge modulation (TEM) and dual edge modulation (DEM). While these systems are convenient in many applications they suffer from a number of disadvantages. Typically each mode, LEM, TEM, DEM is generated by a separate subsystem. LEM and TEM arrangements each require a separate ramp and DEM requires two ramps. In addition, in high-speed applications where pulses are to be generated alternately, sequentially in both halves of a clock cycle, for example, LEM and TEM require two ramp generators and DEM requires four ramp generators. In each instance two comparators are utilized with each ramp generator: the circuit is large and complex. Further, since each mode is generated from separate ramps, there is a certain loss of symmetry, accuracy and switching speed, as well as difficulty in synchronizing or aligning the pulses when switching between modes.

SUMMARY OF INVENTION

It is therefore an object of this invention to provide an improved selectable multimode pulse width modulation system.

It is a further object of this invention to provide such an improved selected multimode pulse width modulation system which requires but one ramp generator to generate all modes: leading edge modulation (LEM), trailing edge modulation (TEM) and dual edge modulation (DEM).

It is a further object of this invention to provide such an improved selected multimode pulse width modulation system which provides high-speed, accurate switching between modes without alignment errors.

It is a further object of this invention to provide such an improved selected multimode pulse width modulation system which is less complex, uses fewer components and requires no alignment adjustment equipment.

The invention results from the realization that a truly simple, reliable, dynamically selectable multimode pulse width modulation system requiring but one ramp to generate all three modes of pulse width modulation—leading edge modulation, trailing edge modulation and dual edge modulation—and which is able to provide high-speed, accurate switching between modes without alignment errors, can be achieved by simultaneously generating leading edge and trailing edge modulation, generating dual edge modulation for the same leading and trailing edge modulation, and selectively gating as output the chosen mode; and the further realization that a series of two (or more) alternating pulses can be generated by using only two (a corresponding number of) ramps.

This invention features a dynamically selectable multimode pulse width modulation system includes a ramp generator means for generating a ramp. Pulse edge modulation means responsive to the ramp generator means defines a leading edge modulated pulse, a trailing edge modulated pulse and a dual edge modulated pulse. Mode selection means responsive to the pulse edge modulation means selects one of the leading edge modulation, trailing edge modulation and dual edge modulation modes of pulse width modulation.

In a preferred embodiment, the pulse edge modulation means includes a variable reference means for providing a variable leading edge and a variable trailing edge reference and a fixed reference means for providing a fixed reference associated with each of the variable references. The variable reference means may include a digital to analog converter having a normal and an inverted output. The pulse edge modulation means may include first means for generating leading edge modulation, second means for generating trailing edge modulation, and third means responsive to the first and second means for generating, for generating dual edge modulation. The first means for generating may include first comparator means for defining a variable leading edge and fixed trailing edge for a leading edge modulation, and a first pulse generator responsive to the first comparator means for generating a leading edge modulated pulse. The second means for generating may include second comparator means for defining the variable trailing edge and fixed leading edge for trailing edge modulation, and a second pulse generator responsive to the second comparator means for generating a trailing edge modulated pulse. The third means for generating may include a third pulse generator responsive to the first and second comparator means for generating a dual edge modulated pulse. The mode selection means may include gate means responsive to the first, second and third means for generating, for passing a selected one of the leading edge modulated pulse, trailing edge modulated pulse, and dual edge modulated pulse.

The invention also features a dynamically selectable multimode pulse width modulation system which includes a ramp generator means for generating a number of ramps. There is a variable reference means for providing a like number of variable leading edge and variable trailing edge references. There are fixed reference means for providing a fixed reference associated with each of the variable references. Pulse edge modulation means produce an alternating like number of sequential pulses. The pulse edge modulation means is responsive to the ramp generator means and the fixed and variable references for selectively defining one of a leading edge modulated pulse and a trailing edge modulated pulse. The pulse edge modulation means is also responsive to the ramp generator means and both of the fixed and variable references for generating a dual edge modulated pulse. There are mode selection means responsive to the pulse edge modulation means for selecting one of the leading edge modulation, trailing edge modulation and dual edge modulation modes of pulse width modulation for each pulse in the alternating sequential pulses.

In a preferred embodiment each of the variable reference means may include a digital to analog converter having a normal and an inverted output. The mode selection means may include mode gate means responsive to the first, second and third means for generating, for passing a selected one of the leading edge modulated pulse, trailing edge modulated pulse and dual edge modulated pulse.

DISCLOSURE OF PREFERRED EMBODIMENT

This invention may be accomplished with a dynamically selectable multimode pulse width modulation system which uses a ramp generator to generate one, two, or more ramps. There is a variable reference means providing one, two or more variable leading edge and variable trailing edge references. This may be a like number—one, two, or more—digital to analog converters which have a normal and an inverted input to provide the two necessary variable references. There is also a fixed reference means which provides a fixed reference associated with each of the variable references, typically one high and one low reference. There is a pulse edge modulation means which produces one, two or more sequentially alternating pulses. The pulse edge modulation means uses a plurality of comparators to respond to each of the ramps in combination with the fixed and variable references to selectively define a leading edge modulated pulse, a trailing edge modulated pulse, and dual edge modulated pulse. Logic gates permit one of these modes of modulation to be chosen for each of the pulses produced.

Figure 1:
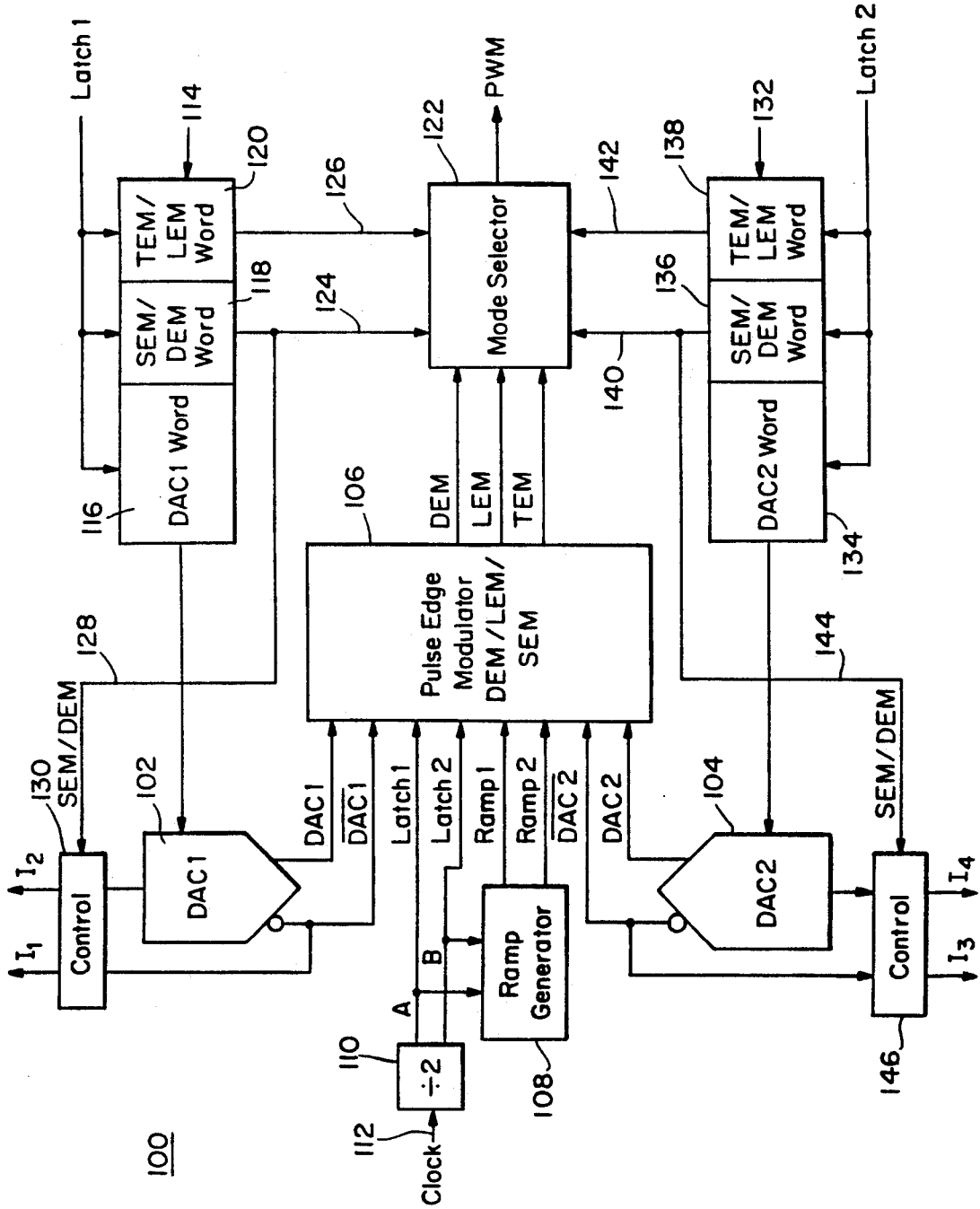
FIG. 1 is a block diagram of a high-speed pulse width modulation system using duplicate ramp generators, digital to analog converters and control circuits to provide odd and even pulses during both halves of each clock cycle.

There is shown in FIG. 1 a dynamically selectable multimode pulse width modulation system 100 according to this invention. In a high-speed pulse width modulation system 100 two digital to analog converters 102 and 104 are used in conjunction with a pulse edge modulator 106 which is capable of generating any one of the three modes DEM, LEM or TEM, so that all the pulses denominated odd and even can be generated sequentially during each half of the divide by two clock signal. Pulse edge modulator 106 receives the DAC1 and $\overline{DAC1}$ output from digital to analog converter 102, the DAC2 and $\overline{DAC2}$ outputs from digital to analog converter 104; and the two ramps, ramp 1 and ramp 2, from ramp generator 108 driven by divide by two circuit 110, which is enabled by the incoming clock signal on line 112. Pulse edge modulator 106 also receives latch 1 and latch 2 signals from the divide by two circuit 110. Latch circuit or register 114 is enabled by latch 1 to receive n bit DAC word 116. The n bit DAC word 116 causes converter 102 to establish the levels of DAC1 and $\overline{DAC1}$. Latch 1 also causes to be loaded in register 114 the SEM/DEM word 118, which indicates whether a single-edge modulation (SEM) or dual edge modulation (DEM) is requested for the next pulse. At the same time, latch 1 causes the TEM/LEM word 120 to be loaded in register 114 to indicate which of the single edge modulation modes is selected if a single-edge modulation has been requested by the SEM/DEM word 118. Thus while pulse edge modulator 106 is generating all three modes of modulation, DEM, LEM and TEM, only one will be selected by mode selector 122 in response to the SEM/DEM word input on line 124 and the TEM/LEM word input on line 126. The SEM/DEM word 118 is also provided over line 128 to control 130. If SEM/DEM word 118 indicates single-edge modulation, then control 130 directs both currents $I_1$ and $I_2$ through converter 102. If SEM/DEM word 118 indicates dual edge modulation, then only the operating current $I_2$ is established through DAC1 and the bias current $I_1$ is drawn through $\overline{DAC1}$. Converter 104 is similarly served by register 132 which contains DAC2 word 134, SEM/DEM word 136 and TEM/LEM word 138, all responsive to the latch 2 signal. SEM/DEM word 136 and TEM/LEM word 138 provide indications on lines 140 and 142 to mode selector 122 in the same manner as associated with register 114. Mode selector 122 under direction from registers 114, 132 selects the mode DEM, TEM, LEM to be outputted and may be considered as including registers 114 and 132. SEM/DEM word 136 provides an indication on line 144 to control circuit 146 which controls the operating current $I_4$ and biasing current $I_3$ for converter 104 in the same way as control 130 does with respect to converter 102.

Figure 2:
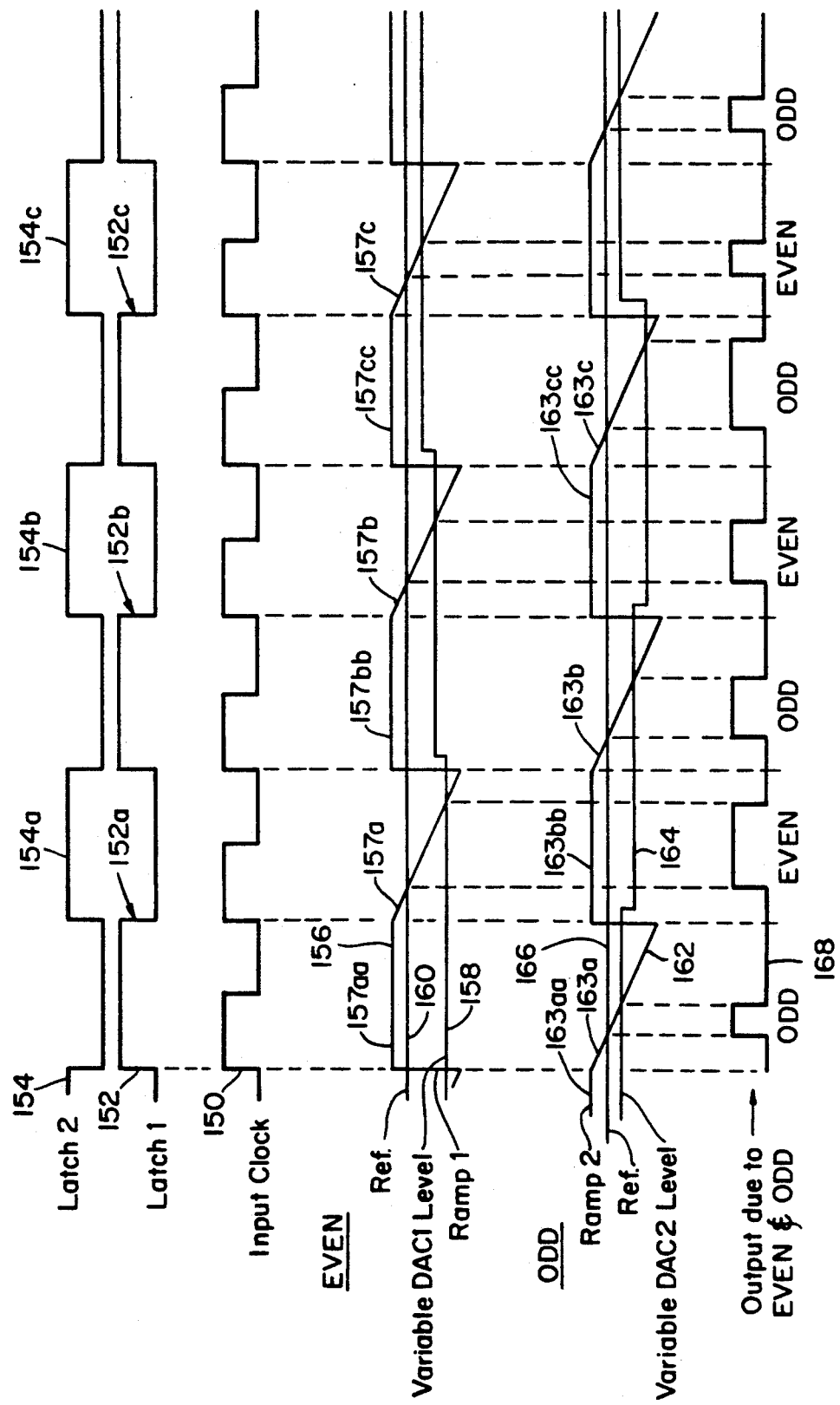
FIG. 2 is an illustration of the waveforms generated when using two ramps to generate odd and even pulses in accordance with the system of FIG. 1.

The various signals occurring in FIG. 1 are shown in FIG. 2. The input clock 150 which appears on line 112 is used to generate latch 1 signal 152 and latch 2 signal 154 during alternate halves of the divide by two input clock cycle. For a simple generation of trailing edge modulated pulses, the even pulses are generated by ramp 1 156 in conjunction with the variable DAC1 level 158 and a fixed reference level 160 which may be supplied externally or generated internally of pulse edge modulator 106. Ramp 1 156 includes ramp portions 157a, b, c and rest portions 157aa, bb, cc. The odd pulses are generated using ramp 2 162 in conjunction with the variable DAC2 level 164 and reference 166. Ramp 2 162 includes ramp portions 163a, b, c, and rest portions 163aa, bb, cc. The resulting series of pulse width modulated pulses is indicated at the series of waveforms labelled 168. Latch 1 is loaded while ramp 2 is active and latch 2 is loaded while ramp 1 is active. Latch 1 drives ramp 2 and latch 2 drives ramp 1.

Figure 3A:
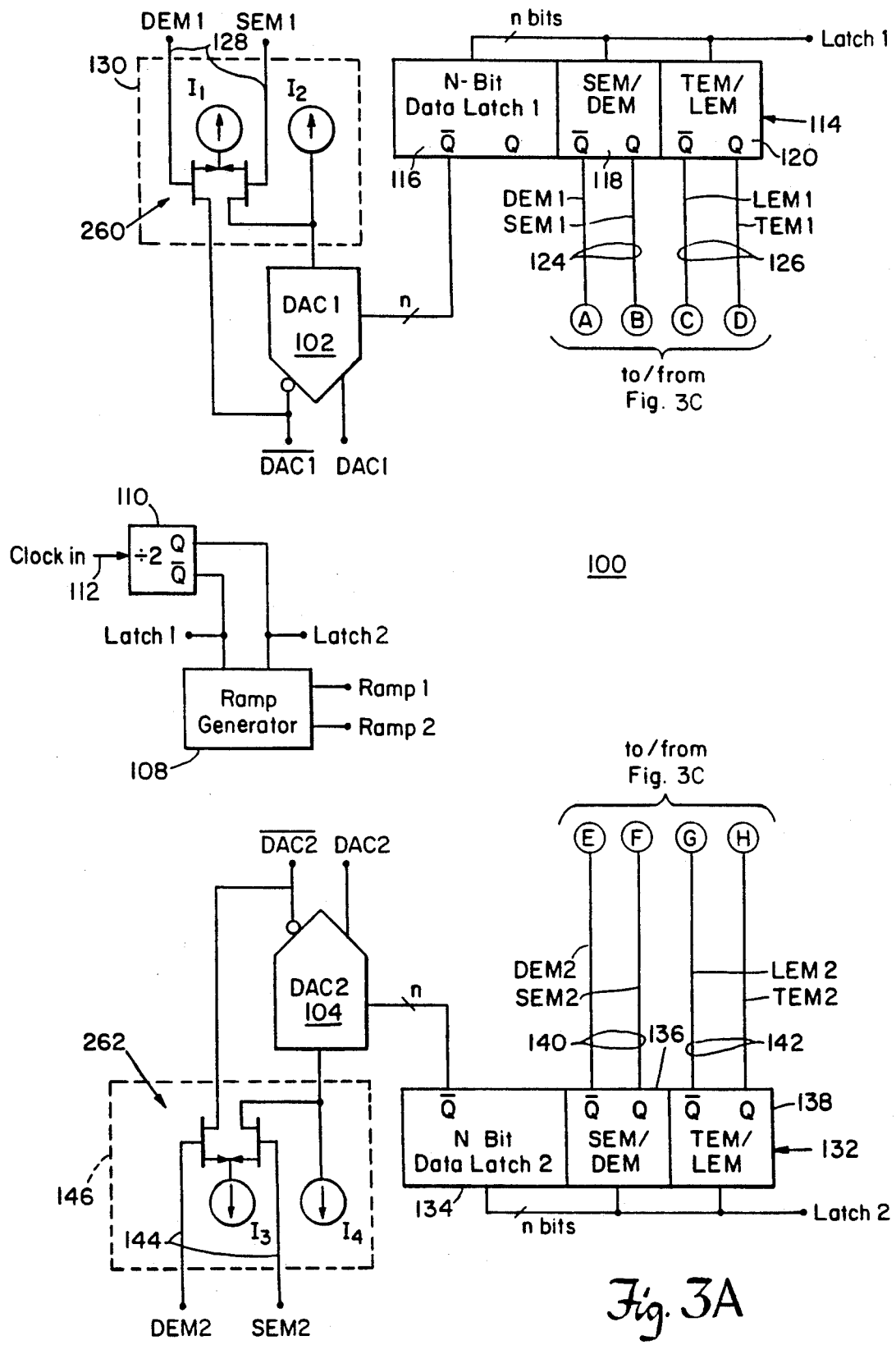
FIG. 3 is a more detailed diagram of the system of FIG. 2.
Figure 3B:
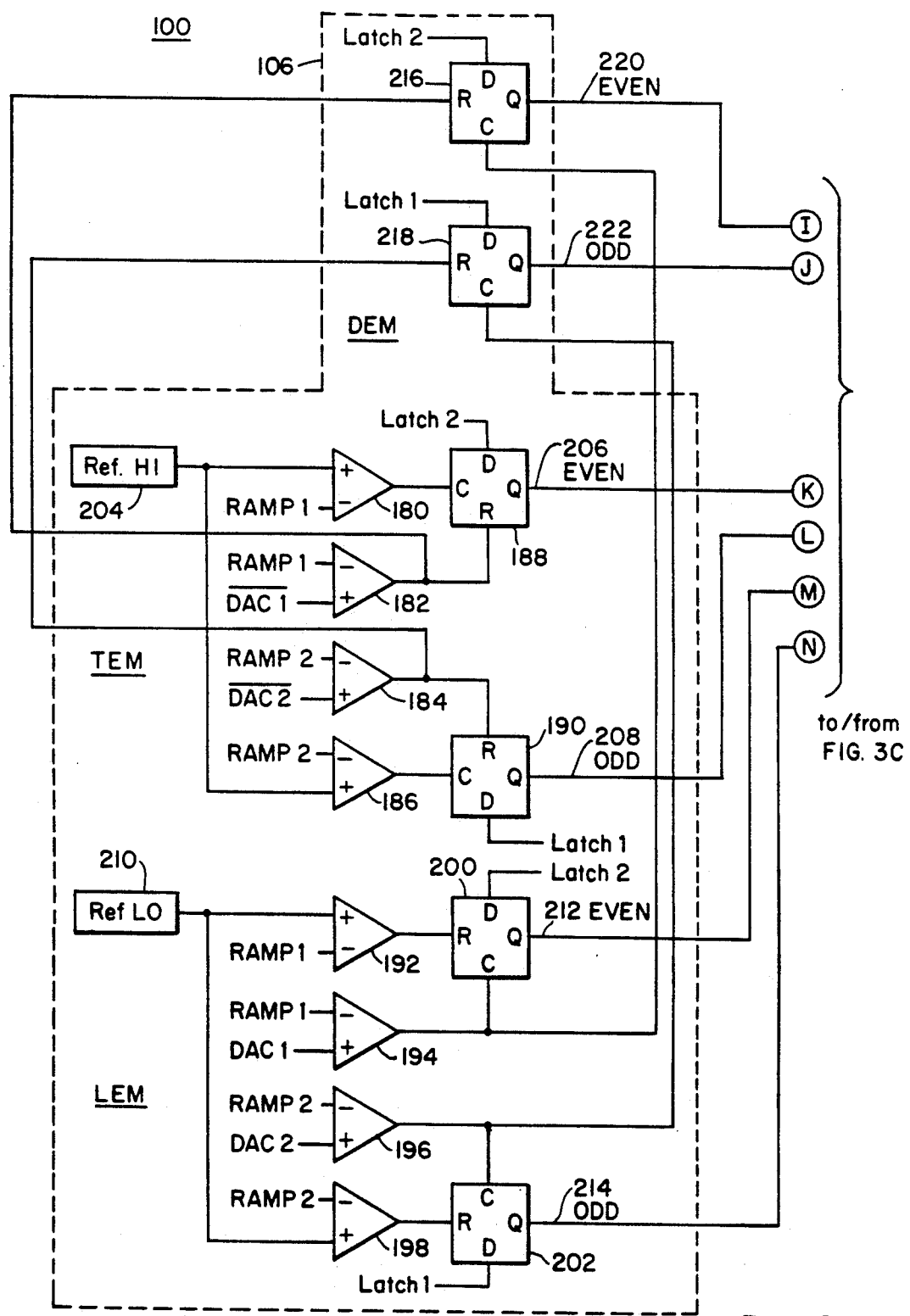
Figure 3C:
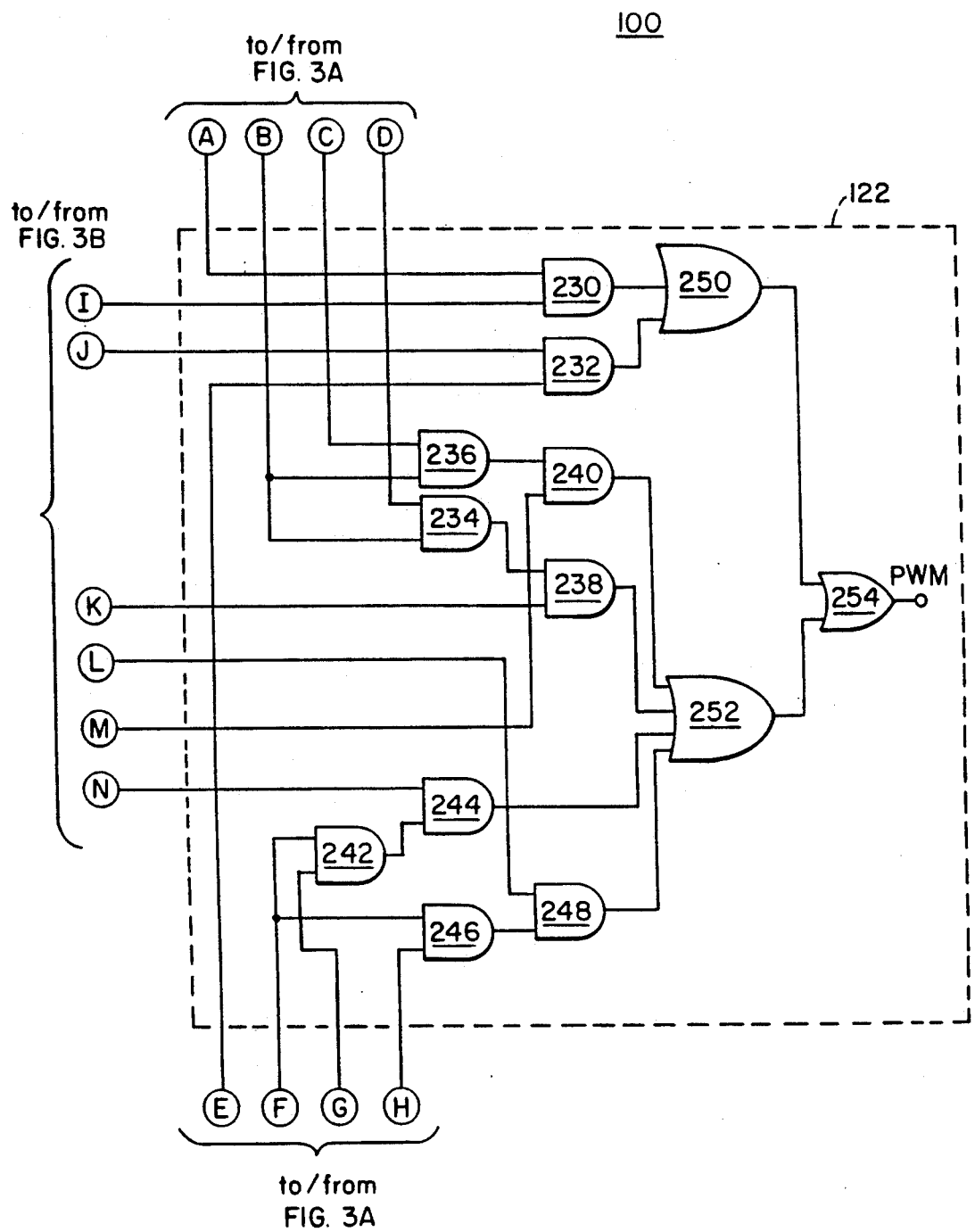

The pulse edge modulator 106 and mode selector 122 of system 100 are shown in greater detail in FIG. 3. Pulse edge modulator 106 includes two sets of four comparators. The upper set of comparators 180, 182, 184 are 186 are used in conjunction with flip-flops or latches 188 and 190 to generate trailing edge modulation (TEM). The lower four comparators 192, 194, 196 and 198 are used in conjunction with latches or flip-flops 200 and 202 to generate leading edge modulation (LEM). Comparator 180 compares the reference input from high reference circuit 204 and ramp 1 to set flip-flop 188 at its input C to establish the fixed leading edge of a TEM pulse. Flip-flop 188 is reset at its input R to define the variable trailing edge of the TEM pulse by the output from comparator 182 which responds to ramp 1 and to the $\overline{DAC1}$ input. The Q output of flip-flop 188 on line 206 thus produces the even pulse in the odd-even set. Flip-flop 188 is enabled to produce such a pulse only during the latch 2 period when the latch 2 signal is present at the D input. The odd pulse for the DEM is produced by flip-flop 190 on line 208 during the latch 1 period when the latch 1 signal is present at the D input to flip-flop 190 and flip-flop 190 is set by comparator 186 which responds to the high reference from reference circuit 204 and ramp 2. Flip-flop 190 is reset by comparator 184 which responds to the ramp 2 and the $\overline{DAC2}$ signal.

Comparator 194 responds to the ramp 1 and DAC1 signals to set flip-flop 200 and define the variable leading edge of the even pulse while comparator 192 responds to the low reference level from low reference circuit 210 and ramp 1 to reset flip-flop 200 and thereby define the even LEM pulse on line 212. Comparator 196 responds to ramp 2 and DAC 2 to set flip-flop 202 defining the variable leading edge of the pulse produced by flip-flop 202 on line 214. This odd pulse on line 214 occurs during the period while flip-flop 202 is enabled.

For dual edge modulation, even latch 216 and odd latch 218 are used. Even latch 216 is set by the output from comparator 194 and reset by the output from comparator 182 to define the variable positions of the leading and the trailing edge of the even pulse provided on line 220. Latch 218 is set by the output of comparator 196 and reset by the output of comparator 184 to define the variable leading and trailing edges of the DEM odd pulse on line 222. In this way, only two ramps are used to constantly generate all three modes of modulation which can be selected in any mix of modes: that is, LEM, TEM and DEM can be selected in any order for even and/or odd pulses, and since they are always present, no synchronization problems occur when one of them is selected by mode selector 122. Pulse edge modulator 106 may be considered as including DACs 102, 104, registers 114, 132, and controls 130, 146.

Mode selector 122 includes two AND gates 230 and 232 associated with DEM latches 216, 218, four AND gates 234, 238, 246 and 248 associated with TEM latches 188 and 190, and four AND gates 242, 244, 236 and 240 associated with LEM latches 200 and 202. These AND gates feed two OR gates 250 and 252 which feed the final OR gate 254. AND gate 230 is enabled to pass the even pulse on line 220 when the $\overline{Q}$ output is high from word 118 in register 114, indicating that dual edge modulation and not single-edge modulation has been chosen. Similarly, AND gate 232 is enabled to pass the odd pulse on line 222 when the $\overline{Q}$ pulse is high in word 136 of register 132. If either one of these AND gates is enabled, then their respective odd or even pulse will be passed to OR gate 250 and on to output OR gate 254.

If in contrast the Q output of SEM/DEM word 118 in register 114 is enabled, then one output is provided to each of AND gates 234 and 236. One of these two AND gates is then enabled depending upon whether the $\overline{Q}$ LEM1, or Q TEM1 outputs of word 120 are high in register 114. If AND gate 236 is enabled, it in turn enables AND gate 240 to pass the even pulse on line 212. If instead AND gate 234 is enabled, then it enables AND gate 238 to pass the even pulse on line 206. In either case, one of those pulses reaches OR gate 252 and is passed to the final output OR gate 254.

In a similar manner, the Q outputs from word 136 in register 132 provides one output to each of AND gates 242 and 246 depending upon whether the $\overline{Q}$ LEM2 output or the Q TEM2 output is high. One of those two gates 242 or 246 will have an output. If 242 has an output it enables AND gate 244 to pass the odd pulse on line 214. If AND gate 246 has an output it enables AND gate 248 to pass the odd pulse on line 208. In either case one of the signals is presented at OR gate 252 from where it is delivered to output OR gate 254.

The switching function of control 130 may be implemented using a differential switch 260. A SEM1 signal causes $I_1$ to be paralleled with $I_2$. A DEM1 output causes $I_1$ to be established with the $\overline{DAC1}$ output of converter 102. In a similar manner, differential circuit 262 in control 146 associated with converter 104 operates to control the path of current $I_3$.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A dynamically selectable multimode pulse width modulation system comprising:
   ramp generator means for generating a ramp;
   pulse edge modulation means responsive to said ramp generator means for defining a leading edge modulated pulse, a trailing edge modulated pulse, and a dual edge modulated pulse; and
   mode selection means, responsive to said pulse edge modulation means, for selecting one of said leading edge modulation said, trailing edge modulation and said dual edge modulation modes of pulse width modulation.

2. The dynamically selectable multimode pulse width modulation system of claim 1 in which said pulse edge modulation means includes variable reference means for providing a variable leading and a variable trailing edge reference; and fixed reference means for providing a fixed reference associated with each of said variable references for defining said leading edge, said trailing edge, and said dual edge modulated pulses.

3. The dynamically selectable multimode pulse width modulation system of claim 2 in which said variable reference means includes a digital to analog converter having a normal and an inverted output.

4. The dynamically selectable multimode pulse width modulation system of claim 1 in which said pulse edge modulation means includes first means for generating leading edge modulation, second means for generating trailing edge modulation and third means, responsive to said first and second means for generating, for generating dual edge modulation.

5. The dynamically selectable multimode pulse width modulation system of claim 4 in which said first means for generating includes first comparator means for defining a variable leading edge and fixed trailing edge for leading edge modulation and a first pulse generator responsive to said first comparator means for generating a leading edge modulated pulse, said second means for generating includes second comparator means for defining a variable trailing edge and fixed leading edge for trailing edge modulation, and a second pulse generator responsive to said second comparator means for generating a trailing edge modulated pulse, and said third means for generating includes a third pulse generator responsive to said first and second comparator means for generating a dual edge modulated pulse.

6. The dynamically selectable multimode pulse width modulation system of claim 4 in which said mode selection means includes gate means, responsive to said first, second and third means for generating, for passing a selected one of a leading edge modulated pulse, trailing edge modulated pulse and dual edge modulated pulse.

7. A dynamically selectable multimode pulse width modulation system comprising:
   ramp generator means for generating a number of ramps;
   pulse edge modulation means for producing an alternating like number of sequential pulses, said pulse edge modulation means being responsive to said ramp generator means for defining a leading edge modulated pulse, a trailing edge modulated pulse and a dual edge modulated pulse; and mode selection means, responsive to said pulse edge modulation means, for selecting one of said leading edge modulation said, trailing edge modulation and said dual edge modulation modes of pulse width modulation for each of said alternating sequential pulses.

8. The dynamically selectable multimode pulse width modulation system of claim 7 in which said pulse edge modulation means includes variable reference means for providing a like number of variable leading and a variable trailing edge references; fixed reference means for providing a fixed reference associated with each of said variable references, for defining said leading edge, said trailing edge and said dual modulated pulses.

9. The dynamically selectable multimode pulse width modulation system of claim 8 in which each said variable reference means includes a digital to analog converter having a normal and an inverted output.

10. The dynamically selectable multimode pulse width modulation system of claim 7 in which said pulse edge modulation means includes first means for generating leading edge modulation, second means for generating trailing edge modulation and third means, responsive to said first and second means for generating, for generating dual edge modulation.

11. The dynamically selectable multimode pulse width modulation system of claim 10 in which said first means for generating includes first comparator means for defining a variable leading edge and fixed trailing edge for leading edge modulation and a first pulse generator responsive to said first comparator means for generating a leading edge modulated pulse, said second means for generating includes second comparator means for defining a variable trailing edge and fixed leading edge for trailing edge modulation, and a second pulse generator responsive to said second comparator means for generating a trailing edge modulated pulse, and said third means for generating includes a third pulse generator responsive to said first and second comparator means for generating a dual edge modulated pulse.

12. The dynamically selectable multimode pulse width modulation system of claim 1 in which said mode selection means includes mode gate means, responsive to said first, second and third means for generating, for passing a selected one of a leading edge modulated pulse, trailing edge modulated pulse and dual edge modulated pulse.

13. The dynamically selectable multimode pulse width modulation system of claim 7 in which said number is two.

14. A dynamically selectable multimode pulse width modulation system comprising:

ramp generator means for generating a ramp;

variable reference means for providing a like number of variable leading and a variable trailing edge references;

fixed reference means for providing a fixed reference associated with each of said variable references;

pulse edge modulation means responsive to said ramp generator means and said fixed and variable references for selectively defining one of a leading edge modulated pulse and a trailing edge modulated pulse, and responsive to said ramp generator means and both of said fixed and variable references for generating a dual edge modulated pulse; and mode selection means, responsive to said pulse edge modulation means, for selecting one of said leading edge modulation said, trailing edge modulation and said dual edge modulation modes of pulse width modulation.

15. A dynamically selectable multimode pulse width modulation system comprising:

ramp generator means for generating a number of ramps;

variable reference means for providing a like number of variable leading and a variable trailing edge references;

fixed reference means for providing a fixed reference associated with each of said variable references;

pulse edge modulation means for producing an alternating like number of sequential pulses, said pulse edge modulation means being responsive to said ramp generator means and said fixed and variable references for selectively defining one of a leading edge modulated pulse and a trailing edge modulated pulse and responsive to said ramp generator means and both of said fixed and variable references for generating a dual edge modulated pulse; and mode selection means, responsive to said pulse edge modulation means, for selecting one of said leading edge modulation said, trailing edge modulation and said dual edge modulation modes of pulse width modulation for each of said alternating sequential pulses.

* * * * *